(12) United States Patent
Chen et al.

(10) Patent No.: US 6,873,505 B2
(45) Date of Patent: Mar. 29, 2005

(54) ELECTROSTATIC DISCHARGE PROTECTIVE CIRCUITRY EQUIPPED WITH A COMMON DISCHARGE LINE

(75) Inventors: Shiao-Shien Chen, Chung-Li (TW); Tien-Hao Tang, Chung-Ho (TW); Mu-Chun Wang, Hsin-Chu (TW)

(73) Assignee: United Microelectronics Corp. (TW)

( * ) Notice: Subject to any disclaimer, the term of this patent is extended or adjusted under 35 U.S.C. 154(b) by 74 days.

(21) Appl. No.: 09/912,288

(22) Filed: Jul. 24, 2001

(65) Prior Publication Data

US 2002/0021538 A1 Feb. 21, 2002

Related U.S. Application Data

(63) Continuation-in-part of application No. 09/396,164, filed on Sep. 14, 1999, now abandoned.

(51) Int. Cl.⁷ .............................................. H02H 9/00
(52) U.S. Cl. ............................................... 361/56
(58) Field of Search ......................... 361/56, 91.1, 111, 361/119

(56) References Cited

U.S. PATENT DOCUMENTS 4,870,530 A  *  9/1989  Hurst et al. .................... 361/56
5,973,901 A  *  10/1999  Narita et al. ................. 361/111

* cited by examiner

*Primary Examiner*—Ronald Leja
(74) *Attorney, Agent, or Firm*—Dickinson Wright PLLC

(57) ABSTRACT

A semiconductor device having an electrostatic discharge protective circuitry adapted to a common discharge line (CDL) is disclosed. In the embodiments of the present invention, semiconductor device includes a plurality of bonding pads, each having at least one connecting terminal, a common discharge line, and a protective device connected between the connecting terminal and the common discharge line. Moreover, the protective device is composed of a silicon-control-rectifier that is used for electrostatic discharge protection and a zener diode for lowering a trigger voltage of the silicon-control-rectifier.

13 Claims, 6 Drawing Sheets

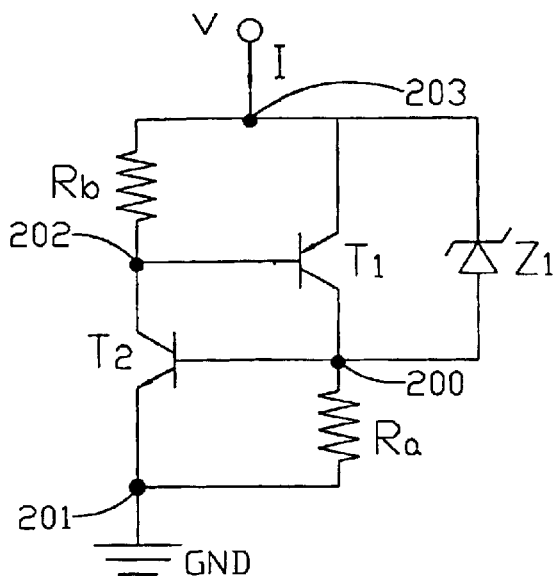
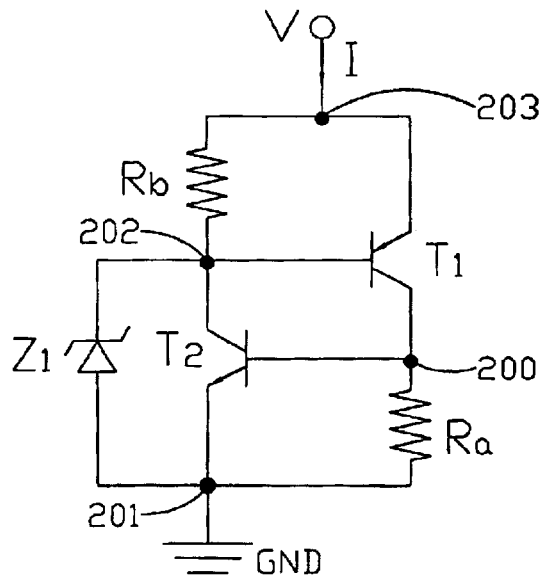
FIG.2A　　　　　　　　FIG.2B
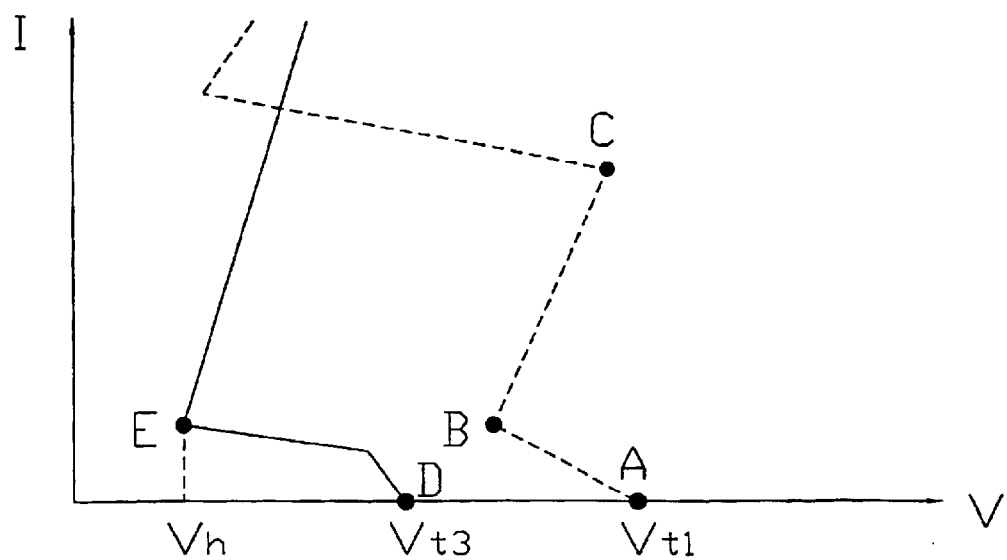
FIG.2C

ELECTROSTATIC DISCHARGE PROTECTIVE CIRCUITRY EQUIPPED WITH A COMMON DISCHARGE LINE

BACKGROUND OF THE INVENTION

This application is a continuation-in-part of U.S. patent application Ser. No. 09/396,164, filed Sep. 14, 1999, now abandoned.

FIELD OF THE INVENTION

The present invention relates to a semiconductor device, and more particularly, to a semiconductor device having an electrostatic discharge protective circuitry adapted to a common discharge line (CDL).

DESCRIPTION OF THE PRIOR ART

Electrostatic discharge ("ESD" hereafter) is a common phenomenon that occurs during handling of semiconductor IC devices. An electrostatic charge may accumulate for various reasons and cause potentially destructive effects on an IC device. Damage typically can occur during a testing phase of its fabrication, during assembly of the IC onto a circuit board, and during use of equipment into which the IC has been installed. Damage to a single IC due to poor ESD protection in an electronic device can hamper some of its designed functions, or sometimes all of them. ESD protection for semiconductor ICs is, therefore, a reliability problem. In order to prevent this, various electrostatic breakdown protection techniques have been proposed. As one such technique discloses, Japanese Patent Application Kokai Publication No. Hei 7-086510 is a semiconductor device that is equipped with a common discharge line (CDL).

The conventional design for preventing ESD damage is a prodigious network that, for the most part, involves locating a protection circuit between the input/output pads and the V.sub.SS terminal, between the input/output pads and the V.sub.DD terminal, and between the V.sub.SS and V.sub.DD power rails. Accordingly, such a prodigious network consumes a great amount of layout area, especially when used in a configuration including multi-power buses. Moreover, no ESD protection is provided between any two IC pads using the conventional design. Thus, ESD stress arising between two IC pads is only indirectly bypassed via the protection circuit located between the V.sub.SS and V.sub.DD power rails.

However, the ESD pulse will boost the electric potential at the power rails, resulting in potential damage to the internal circuitry. K. Narita et al. have proposed another ESD protection circuit design in their article entitled "A NOVEL ON-CHIP ELECTROSTATIC DISCHARGE (ESD) PROTECTION FOR BEYOND 500 MHz DRAM," IEDM Proceeding, 1995, pp. 539–542. However, this design also features a common discharge line as a discharge path.

FIG. 1A shows a conventional gate-grounded NMOS field-effect transistor that is commonly used in ESD protection circuit design, wherein its gate electrode is tied to its source electrode at node 10 and connected to the ground, GND. The current-voltage, I–V, characteristics of the gate-grounded NMOS field-effect transistor is shown in FIG. 1B. Referring to what is shown in FIG. 1B, the voltage V across the drain and source electrode of the gate-grounded NMOS field-effect transistor, shown in FIG. 1A, is greater than the threshold voltage $V_{t1}$, referring to point $A_1$ the gate-grounded NMOS field-effect transistor is then triggered. The gate-grounded NMOS field-effect transistor snapback at point B where the voltage V reaches $V_{sb}$ value, moreover, it enters the second breakdown region at point C where the voltage V is at $Vt_2$ value. Once the gate-grounded NMOS field-effect transistor enters the second breakdown region, thermal runaway will occur, easily resulting in device damages.

The gate-grounded NMOS field-effect transistor combines with a diode to form an ESD protection circuit that features a common discharge line as a discharge path. The overall ESD protection circuit for this particular example is shown in FIG. 1C. The protection circuit between any two pads is schematically depicted, wherein the circuit between Pad 1 and Pad 2 is shown by way of example. When an ESD stress having a positive polarity with respect to Pad 1 arises at Pad 2, the associated ESD voltage is coupled to a gate-grounded NMOS field-effect transistor $N_2$, and thus triggers the NMOS field-effect transistor $N_2$ to be operated in snapback mode. Consequently, a great amount of ESD discharge current $I_1$ flows from Pad 2, through a common discharge line 30, to Pad 1, because the diode $D_1$ is forward biased.

Conversely, when an ESD stress having a negative polarity with respect to Pad 1 arises at Pad 2, the associated ESD voltage is coupled to a gate-grounded NMOS field-effect transistor $N_1$, and thus triggers the NMOS field-effect transistor $N_1$ to be operated in snapback mode. Consequently, a great amount of ESD discharge current $I_2$ flows from Pad 1, through the common discharge line 30 and then to Pad 2, because the diode $D_2$ is forward biased. This symmetrical characteristic of the discharge path which accompanies the simplification in ESD protection design contributes to the advantages of using CDL structure in ESD protection design.

Nevertheless, the triggering voltage of using a gate-grounded NMOS field-effect transistor and a diode as ESD elements between a Pad and the common discharge line is too high to protect submicron IC devices in the conventional method. Moreover, as mentioned earlier, once the gate-grounded NMOS field-effect transistor enters the second breakdown region, thermal runaway is likely to occur, hence easily results in device damages. Furthermore, ESD protection by using the conventional method is easily restricted in the CMOS process, this is because the channel length of the gate-grounded NMOS field-effect transistor needs to be smaller than the output NMOS for making sure that the gate-grounded NMOS field-effect transistor breaks down before the output NMOS.

It is therefore an object of the present invention to provide an enhanced ESD protection performance apparatus, which is equipped with a common discharge line, for protecting VLSI circuits and particularly CMOS devices.

SUMMARY OF THE INVENTION

An object of the present invention is to substantially eliminate one or more of the problems caused by limitations and disadvantages of the related art.

Another object of the present invention is to provide an ESD protection network having a triggering voltage and a holding voltage lower than that of the conventional design which can effectively make submicron IC devices immune to ESD damage.

A further object of the present invention is to provide an enhanced ESD protection performance apparatus, which is equipped with a common discharge line, for protecting VLSI circuits and particularly CMOS devices.

In accordance with the present invention, there is provided a semiconductor device having an electrostatic discharge protective circuitry adapted to a common discharge line (CDL). In the embodiments of the present invention, the semiconductor device includes a plurality of bonding pads, each having at least a terminal, a common discharge line, and a protective device connected between the terminal of at least one bonding pad and the common discharge line. Moreover, the protective device includes a thyristor, typically a silicon-control-rectifier, used for electrostatic discharge protection and a triggering device, typically a zener diode, for lowering a trigger voltage of the thyristor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 2A and FIG. 2B schematically depicts a low triggering voltage SCR having a zener diode trigger in two different arrangements;

FIG. 2C shows the I–V characteristics of the low triggering voltage SCR of both FIG. 2A and FIG. 2B;

DESCRIPTION OF THE PREFERRED EMBODIMENT

Figure 1A:
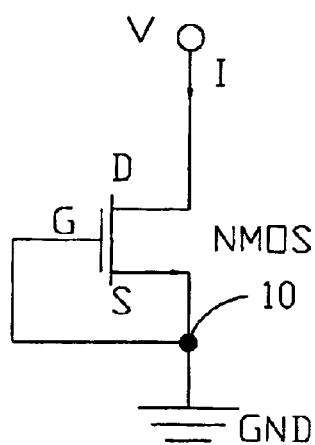
FIG. 1A schematically depicts a gate-grounded NMOS FET which is conventionally used as an ESD protection element.
Figure 1B:
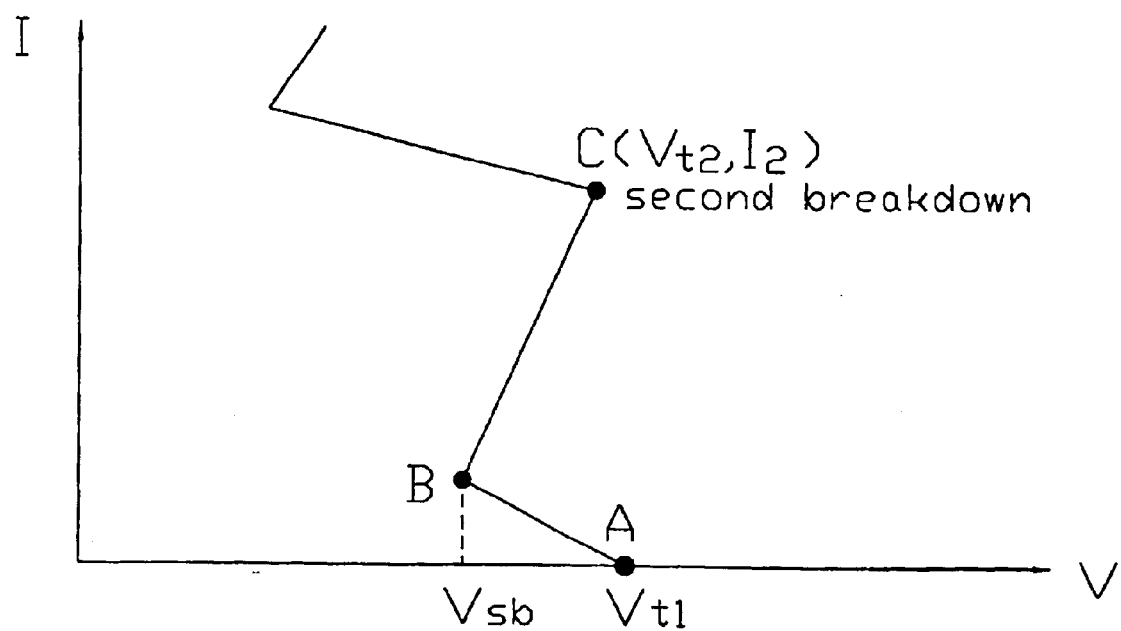
FIG. 1B shows the I–V characteristics of the gate-grounded NMOS field-effect transistor of FIG. 1A.
Figure 1C:
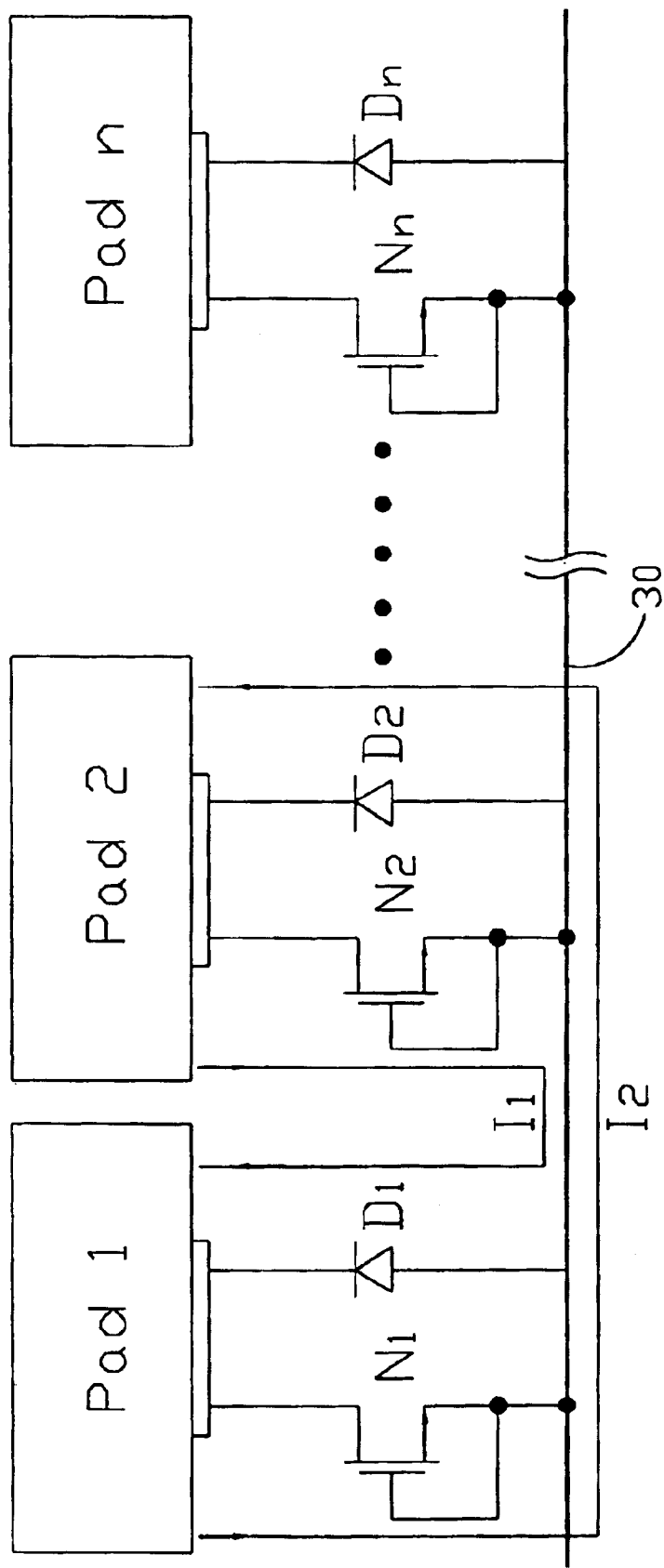
FIG. 1C schematically depicts a conventional CDL ESD protection circuitry between any two IC Pads.
Figure 2D:
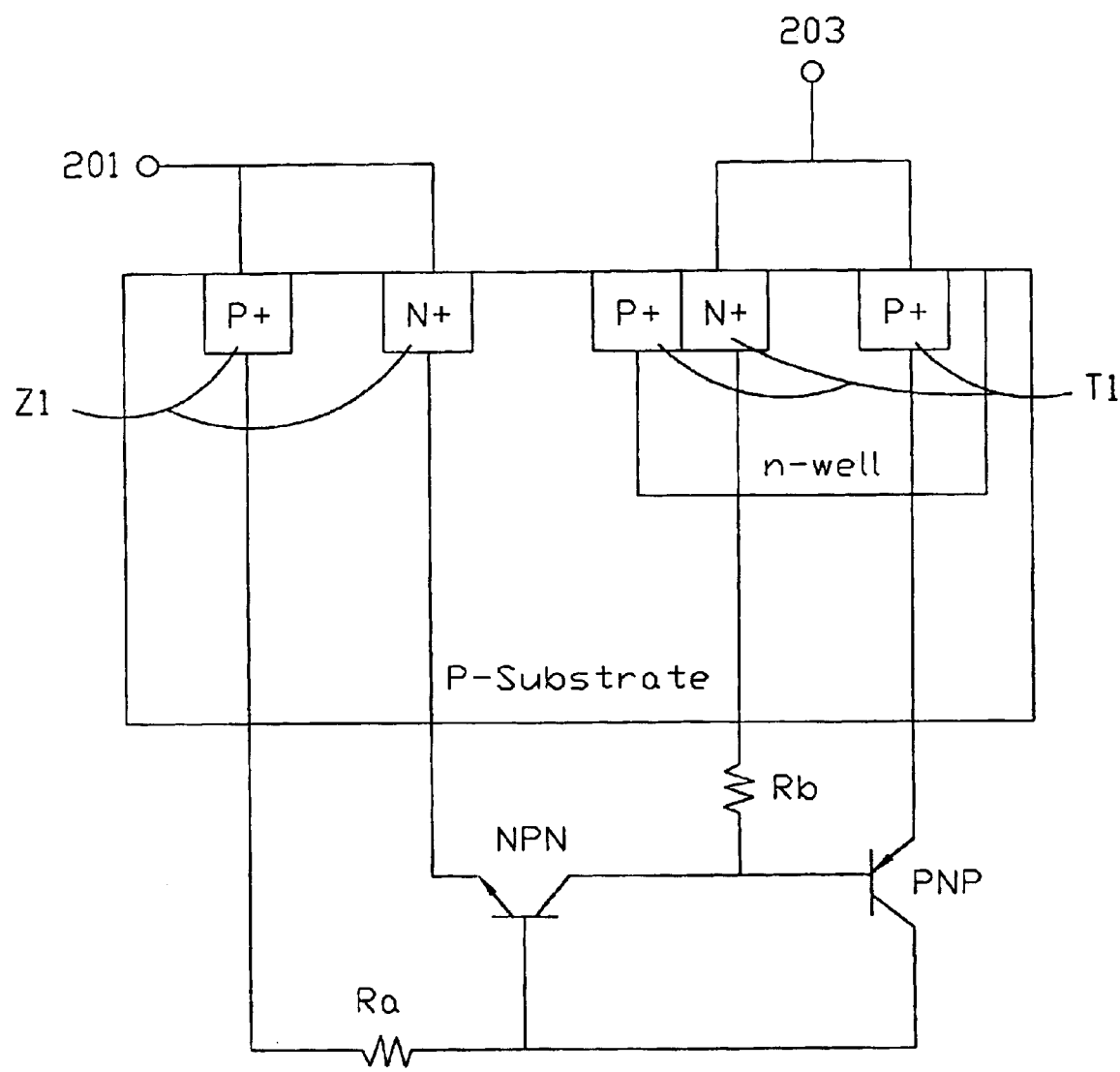
FIG. 2D shows the connection between the zener diode and the PNP transistor in the CMOS process.

Before describing details of the present invention, a low triggering voltage SCR serves as the main component in an ESD protection circuit will be first described with reference to FIG. 2A and FIG. 2B. In both the drawings, the SCR device consists essentially of a PNP bipolar junction transistor $T_1$ and an NPN bipolar junction transistor $T_2$. The collector of the PNP transistor $T_1$ is connected together with the base of the NPN transistor $T_2$, forming a cathode gate identified by the node 200. The cathode gate 200 is coupled to the emitter of the NPN transistor $T_2$, via a spreading resistor $R_a$, constituting a cathode 201, which is connected to a ground terminal GND. The base of the PNP transistor $T_1$ is connected together with the collector of NPN transistor $T_2$ to form an anode gate identified by the node 202. The anode gate 202 is coupled to the emitter of the PNP transistor $T_1$, via a spreading resistor $R_b$, constituting an anode 203. To achieve a reduction of the SCR triggering voltage from about 30–50 volts to a level of about 5–10 volts, a zener diode $Z_1$ is incorporated in the SCR device as a trigger. The zener diode $Z_1$ can be placed in between the anode 203 and the cathode gate 200, like what is shown in FIG. 2A, or in between the anode gate 202 and the cathode 201, like what is shown in FIG. 2B. No matter of which, when either transistor is triggered to turn ON, it turns ON the other and both stay ON until the current is interrupted. As noted above, the SCR is an ideal device for on-chip protection against ESD since in its ON state it protects sensitive devices by virtue of its comparatively low resistance. In this invention, the PNP bipolar junction transistor $T_1$ of the SCR device can connect with the zener diode $Z_1$ in the CMOS process, as shown in FIG. 2D. Because the SCR device comprise the zener diode $Z_1$, it is not necessary that the SCR device combines with a diode, and that the zener diode $Z_1$ is not additional, it must be connected with the PNP bipolar junction transistor $T_1$ to form the SCR device, wherein anode 203 is connected with a N+junction and one of P+junctions of $T_1$, and another P+junction of $T_1$ is formed by way of using additional implantation.

FIG. 2C shows the I–V characteristics of the low triggering voltage SCR with zener diode depicts in both FIGS. 2A and 2B. Referring to FIG. 2C, one can see that when the voltage V across the anode and the cathode of the low triggering voltage SCR of both FIGS. 2A and 2B is greater than the threshold voltage $Vt_3$. Referring to point D, the SCR is then triggered. Sequentially, a low-holding voltage $V_h$ is quite low, and the resulting power consumption is small. In the meanwhile, using a zener diode as a triggering element makes the SCR have a much lower triggering voltage at point D as compared to the conventional element at point A.

Figure 3:
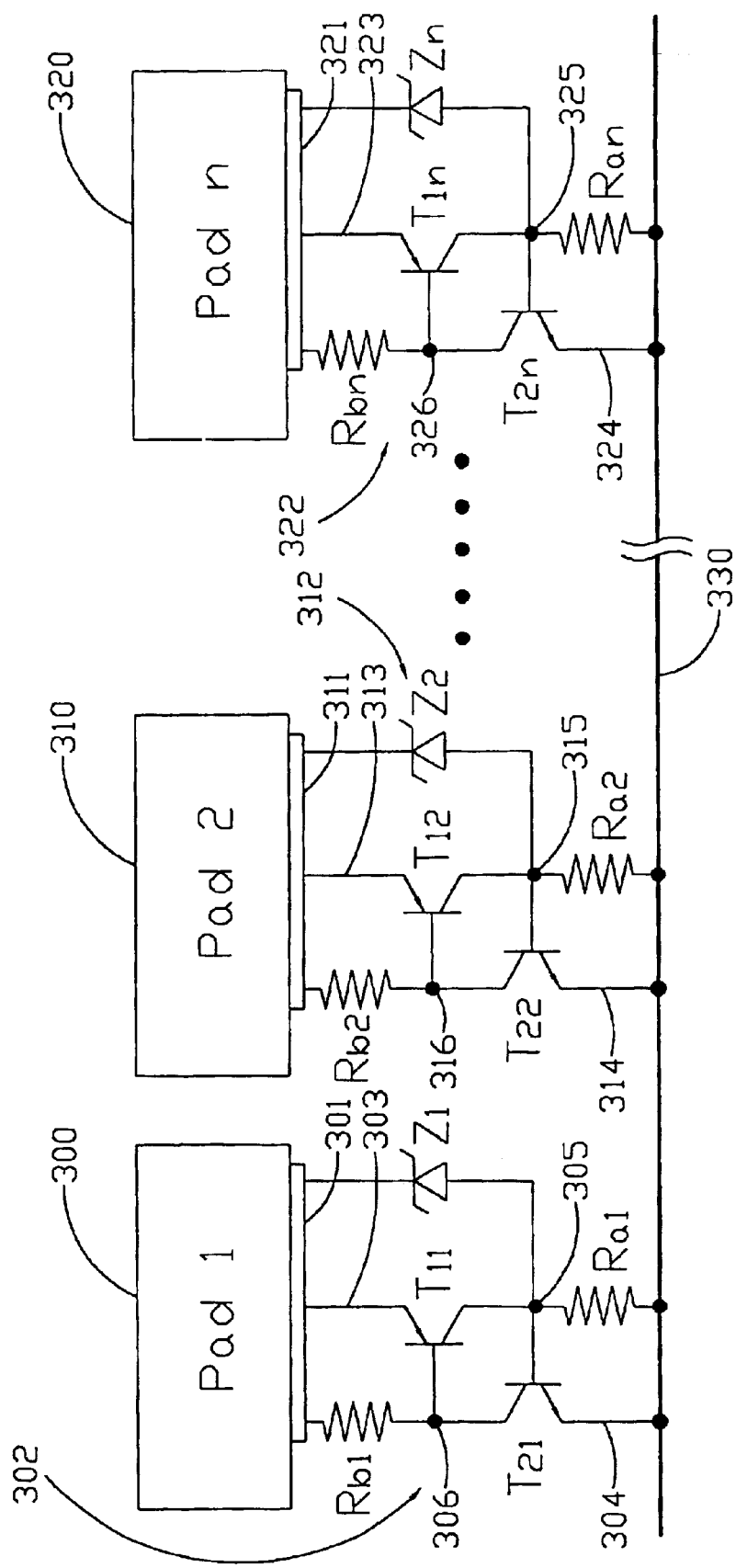
FIG. 3 schematically depicts a modified CDL ESD protection circuitry of an embodiment of the present invention.

FIG. 3 schematically depicts a semiconductor device with a modified CDL (Common Discharge Line) ESD (Electrostatic Discharge) protection circuitry of an embodiment of the present invention, which utilizes the low triggering voltage SCR with zener diode as depicted in FIG. 2A. The semiconductor device comprises a plurality of bonding pads 300, 310 and 320, possibly a mixture of input pads, output pads, $V_{DD}$ pads, and/or $V_{SS}$ pads, each having at least one connecting terminal 301, 311 and 321; a common discharge line 330 with an open-ended design, that is, neither grounded nor connected to any source; and a protective device 302, 312 and 322 connected between the connecting terminal of at least one bonding pad and the common discharge line. The protective devices 302, 312 and 322 are connected between the connecting terminal of at least one bonding pad and the common discharge line. The protective devices 302, 312 and 322 each includes a silicon-control-rectifier used for electrostatic discharge protection and a zener diode $Z_1$, $Z_2$ and $Z_n$ for lowering a trigger voltage of the silicon-control-rectifier.

Moreover, the silicon-control-rectifier composes of a PNP bipolar transistor $T_{11}$, $T_{12}$ and $T_{1n}$ with an emitter 303, 313 and 323 connected to the connecting terminal of at least one bonding pad. A NPN bipolar transistor $T_{21}$, $T_{22}$ and $T_{2n}$ with an emitter 304, 314 and 324 connected to the common discharge line 330. A first resistor $R_{a1}$, $R_{a2}$ and $R_{an}$ wit a first end 305, 315 and 325 connected to a collector of the PNP bipolar transistor and a base of the NPN bipolar transistor. It also includes a second end connected to the common discharge line 330 and a second resistor $R_{b1}$, $R_{b2}$ and $R_{bn}$ with a first end connected to the connecting terminal of at least one bonding pad. Further shown is a second end 306, 316 and 326 connected to a base of the PNP bipolar transistor and a collector of the NPN bipolar transistor The zener diodes $Z_1$, $Z_2$ and $Z_n$ of the present embodiment are placed across the emitters and the collectors of the PNP bipolar transistors $T_{11}$, $T_{12}$ and $T_{1n}$, that is, anodes of the zener diodes are connected to the connecting terminals 301, 311 and 321 and cathodes of the zener diodes are connected to the first end 305, 315 and 325 of the first resistor R.sub.a1, R.sub.a2 and R.sub.an.

Furthermore, when the bonding pad 300 positive stress to the bonding pad 310, the discharge current flows from the bonding pad 300, through the triggering device, i.e. the zener diode Z1, for lowering the trigger voltage of the thyristor, i.e. the PNP bipolar junction transistor T11 and the NPN bipolar junction transistor T21, the common discharge line 330 and the zener diode Z2, and then flows to the bonding pad 310, before the thyristor coupling to the bonding pad 300 is turned on. After the thyristor coupling to the bonding pad 300 is turned on, the discharge current flows from the bonding pad 300, through the thyristor coupling to the bonding pad 300, the common discharge line 330 and the zener diode Z2, and then flows to the bonding pad 310. On the contrary, when the bonding pad 300 negative stress to the bonding pad 310, the discharge current flows from the bonding pad 310, through the triggering device, i.e. the zener diode Z2, for lowering the trigger voltage of the thyristor, i.e. the PNP bipolar junction transistor T12 and the NPN bipolar junction transistor T22, the common discharge line 330 and another triggering device, i.e. the zener diode Z1 coupling to the bonding pad 300, and then flows to the bonding pad 300; before the thyristor coupling to the bonding pad 310 is turned on. After the thyristor coupling to the bonding pad 310 is turned on, the discharge current flows from the bonding pad 310, through the thyristor coupling to the bonding pad 310, the common discharge line 330 and the zener diode Z1, and then flows to the bonding pad 300. Namely, if the discharge current flows through and breaks down the triggering device, i.e. the zener diode Z1, the thyristor, i.e. the PNP bipolar junction transistor T11 and the NPN bipolar junction transistor T21, are triggered to be operated. If the discharge current flows through and breaks down the triggering device, i.e. the zener diode Z2, the thyristor, i.e. the PNP bipolar junction transistor T12 and the NPN bipolar junction transistor T22, are triggered to be operated. When the discharge current flows through but does not break down the triggering device, i.e. the zener diode Z1, the thyristor, i.e. the PNP bipolar junction transistor T11 and the NPN bipolar junction transistor T21, are not operated. When the discharge current flows through but does not break down the triggering device, i.e. the zener diode Z2, the thyristor, i.e. the PNP bipolar junction transistor T12 and the NPN bipolar junction transistor T22, are not operated.

Figure 4:
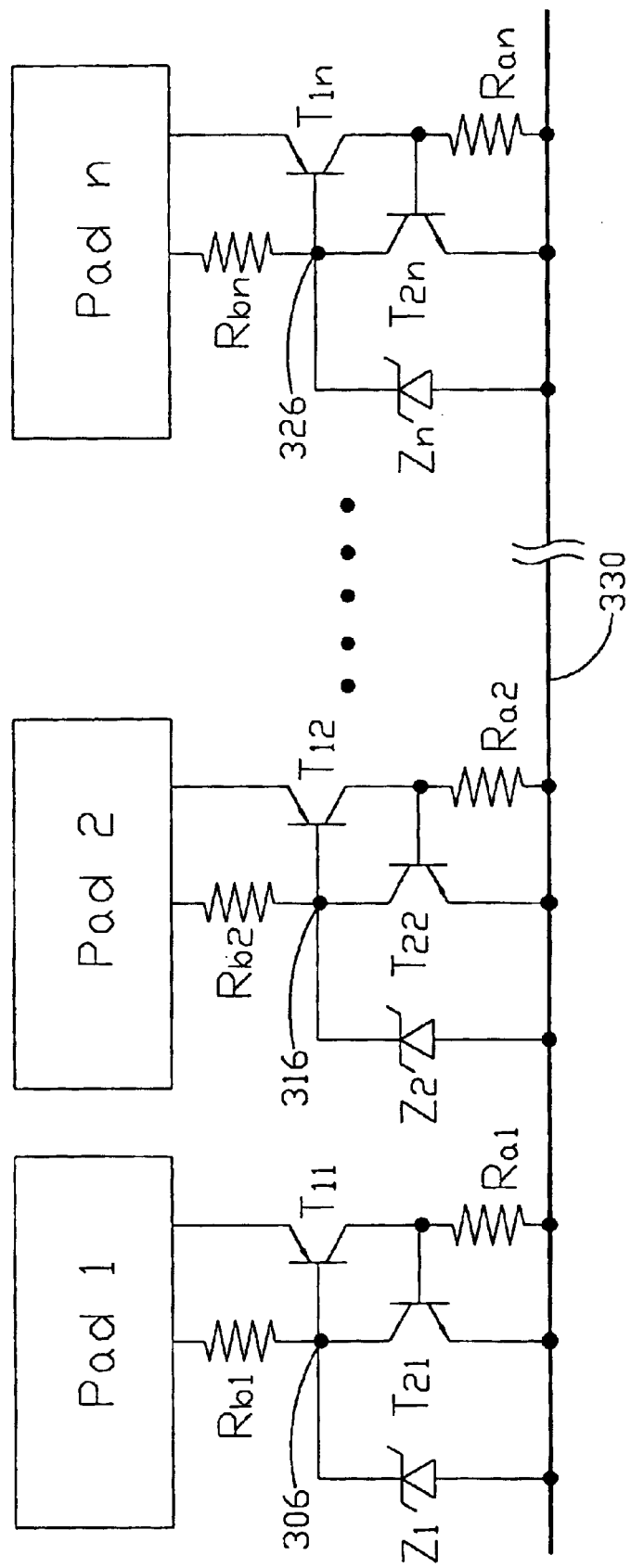
FIG. 4 schematically depicts a modified CDL ESD protection circuitry of another embodiment of the present invention.

FIG. 4 shows another embodiment of the present invention, which is very similar to the previous embodiment but with different placement of the zener diodes also for the purpose of reducing the triggering voltage of SCR devices for CDL ESD protection circuitry. The zener diodes Z.sub.1, Z.sub.2 and Z.sub.n of the present embodiment are placed across the collectors and the emitters of the NPN bipolar transistors T.sub.21, T.sub.22 and T.sub.2n. That is, anodes of the zener diodes are connected to the second ends 306, 316 and 326 of the second resistors R.sub.b1, R.sub.b2 and R.sub.bn, and cathodes of the zener diodes are connected to the common discharge line 330

In conclusion, a semiconductor device having electrostatic discharge protective circuitry adapted to a common discharge line (CDL) is disclosed by the present invention with two embodiments wherein the intrinsic symmetrical characteristics of the discharge path is accompanied by the simplification in ESD protection design of using CDL structure have been brought into practice fully in ESD protection design by the present invention.

Of course, it is possible to apply the present invention to the ESD protection network with a SCR, and also it is possible for the present invention to protect any one ESD circuit and effectively make submicron IC devices immune to ESD damage. Also, this invention can be applied to provide the SCR with the zener diodes concerning ESD protection circuit used for protecting the device has not developed at present. The ESD structure of the present invention is the best integrated circuit structure.

Obviously, many modifications and variations of the present invention are possible in light of the above teachings. It is therefore to be understood that within the scope of the appended claims, that the present invention may be practice other than as specifically described herein.

Although specific embodiments have been illustrated and described, it will be obvious to those skilled in the art that various modifications may be made without departing from what is intended to be limited solely by the appended claims.

What is claimed is:

1. An electrostatic discharge protective device, said electrostatic discharge protective device comprising:

a first bipolar junction transistor and second bipolar junction transistor, wherein, the base of said first bipolar junction transistor is connected together with the collector of said second bipolar junction transistor to form a first node, and the collector of said first bipolar junction transistor is connected together with the base of said second bipolar junction transistor to forming a second node;

a first resistor, wherein said first node is coupled to the emitter of said first bipolar junction transistor, via first resistor, constituting a first pole;

a second resistor, wherein said second node is coupled to the emitter of said second bipolar junction transistor, via said second resistor, constituting a second pole; and a triggering device, wherein said triggering device including a zener diode is placed between said second pole and said first node;

wherein when a current flows through and breaks down said zener diode, said first bipolar junction transistor and said second bipolar junction transistor are triggered to be operated, when said current flows through but does not break down said zener diode, said first bipolar junction transistor and said second bipolar junction transistor are not operated.

2. The protective device according to claim 1, wherein said first bipolar junction transistor comprises a NPN bipolar junction transistor.

3. The protective device according to claim 1, wherein said second bipolar junction transistor comprises a PNP bipolar junction transistor.

4. The protective device according to claim 1, wherein said first bipolar junction transistor and said second bipolar junction transistor are connect to constitute a silicon-control-rectifier.

5. The protective device according to claim 1, wherein said first node comprises a cathode gate.

6. The protective device according to claim 1, wherein said second node comprises an anode gate.

7. The protective device according to claim 1, wherein said first pole comprises a cathode.

8. The protective device according to claim 1, wherein said second pole comprises an anode.

9. The protective device according to claim 1, wherein the triggering voltage of said zener diode is in a range of about 5 to 10 volts.

10. An electrostatic discharge protective device, said electrostatic discharge protective device comprising:

a thyristor having a cathode and an anode, wherein said cathode connects to a common discharge line and said anode connects to a terminal of a bonding pad;

a PNP bipolar junction transistor, an NPN bipolar junction transistor, a first spreading resistor and a second spreading resistor constituting said thyristor, wherein the collector of said PNP bipolar junction transistor is connected together with the base of said NPN bipolar junction transistor to form a cathode gate, and the base of said PNP bipolar junction transistor is connected together with the collector of said NPN bipolar junction transistor to form an anode gate;

said cathode gate is coupled to the emitter of said NPN bipolar junction transistor, via said first spreading resistor, constituting said cathode;

said anode gate is coupled to the emitter of said PNP bipolar junction transistor, via said second spreading resistor, constituting an anode; and a triggering device having a zener diode, said triggering device is placed between said anode and said cathode gate;

wherein when a current flows through and breaks down said zener diode, said thyristor is triggered to be operated, when said current flows through but does not break down said zener diode, said thyristor is not operated.

11. The protective device according to claim 10, wherein the triggering voltage of said triggering device is in a range of about 5 to 10 volts.

12. An electrostatic discharge protective circuitry, said semiconductor device comprising:

a bonding pad having a terminal;

a common discharge line with open-ended design, that is, neither grounded nor connected to any source;

a PNP bipolar junction transistor, wherein the emitter of said PNP bipolar junction transistor is connected to said terminal of said bonding pad;

an NPN bipolar junction transistor, wherein the emitter of said NPN bipolar junction transistor is connected to said common discharge line;

a first resistor that is coupled with said common discharge line, wherein said first resistor is connected the collector of said PNP bipolar junction transistor with the base of said NPN bipolar junction transistor to form a cathode gate;

a second resistor that is coupled with said terminal of said bonding pad, wherein said second resistor is connected a base of said PNP bipolar junction transistor with the collector of said NPN bipolar junction transistor to form an anode gate; and a trigger device having a zener diode, said trigger device is connected to said terminal of said bonding pad with said cathode gate;

wherein when a current flows through and breaks down said zener diode, said PNP bipolar junction transistor and said NPN bipolar junction transistor are triggered to be operated, when said current flows through but does not break down said zener diode, said PNP bipolar junction transistor and said NPN bipolar junction transistor are not operated.

13. The protective device according to claim 12, wherein the triggering voltage of said trigger device in a range of about 5 to 10 volts.

* * * * *